United States Patent
Subramanian et al.

(10) Patent No.: US 6,684,172 B1
(45) Date of Patent: Jan. 27, 2004

(54) SENSOR TO PREDICT VOID FREE FILMS USING VARIOUS GRATING STRUCTURES AND CHARACTERIZE FILL PERFORMANCE

(75) Inventors: Ramkumar Subramanian, San Jose, CA (US); Steven C. Avanzino, Cupertino, CA (US); Christopher F. Lyons, Fremont, CA (US); Khoi A. Phan, San Jose, CA (US); Bharath Rangarajan, Santa Clara, CA (US); Bhanwar Singh, Morgan Hill, CA (US); Cyrus E. Tabery, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 123 days.

(21) Appl. No.: 10/034,165

(22) Filed: Dec. 27, 2001

(51) Int. Cl.[7] .............................................. G01L 25/00
(52) U.S. Cl. ........................... 702/105; 438/14; 438/16; 427/8; 427/9; 427/10; 356/601
(58) Field of Search .............................. 702/105; 427/8, 427/9, 10; 356/601; 438/14, 16

(56) References Cited

U.S. PATENT DOCUMENTS

| | | | | |
|---|---|---|---|---|
| 4,073,964 A | * | 2/1978 | Herrmann | 427/10 |
| 4,141,780 A | * | 2/1979 | Kleinknecht et al. | 117/85 |
| 4,939,370 A | * | 7/1990 | Meyer et al. | 250/372 |
| 5,552,327 A | * | 9/1996 | Bachmann et al. | 216/60 |
| 5,754,297 A | * | 5/1998 | Nulman | 356/630 |
| 6,383,824 B1 | * | 5/2002 | Lensing | 438/14 |
| 6,493,070 B1 | * | 12/2002 | Jaing et al. | 356/72 |

\* cited by examiner

*Primary Examiner*—John Barlow
*Assistant Examiner*—Anthony Dougherty
(74) *Attorney, Agent, or Firm*—Amin & Turocy, LLP

(57) ABSTRACT

One aspect of the invention relates to a metal fill process and systems therefor involving providing a standard calibration wafer having a plurality of fill features of known dimensions in a metalization tool; depositing a metal material over the standard calibration wafer; monitoring the deposition of metal material using a sensor system, the sensor system operable to measure one or more fill process parameters and to generate fill process data; controlling the deposition of metal material to minimize void formation using a control system wherein the control system receives fill process data from the sensor system and analyzes the fill process data to generate a feed-forward control data operative to control the metalization tool; and depositing metal material over a production wafer in the metalization tool using the fill process data generated by the sensor system and the control system. The invention further relates to tool characterization processes and systems therefor.

20 Claims, 10 Drawing Sheets

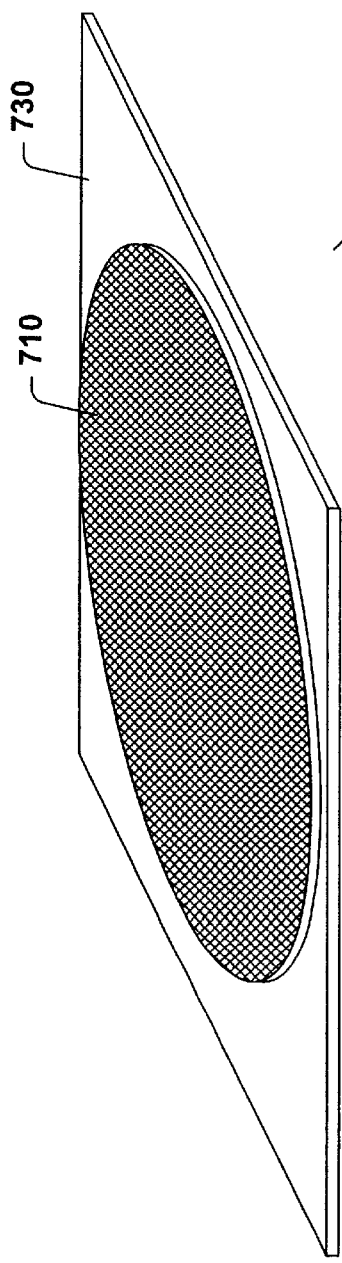
Fig. 9
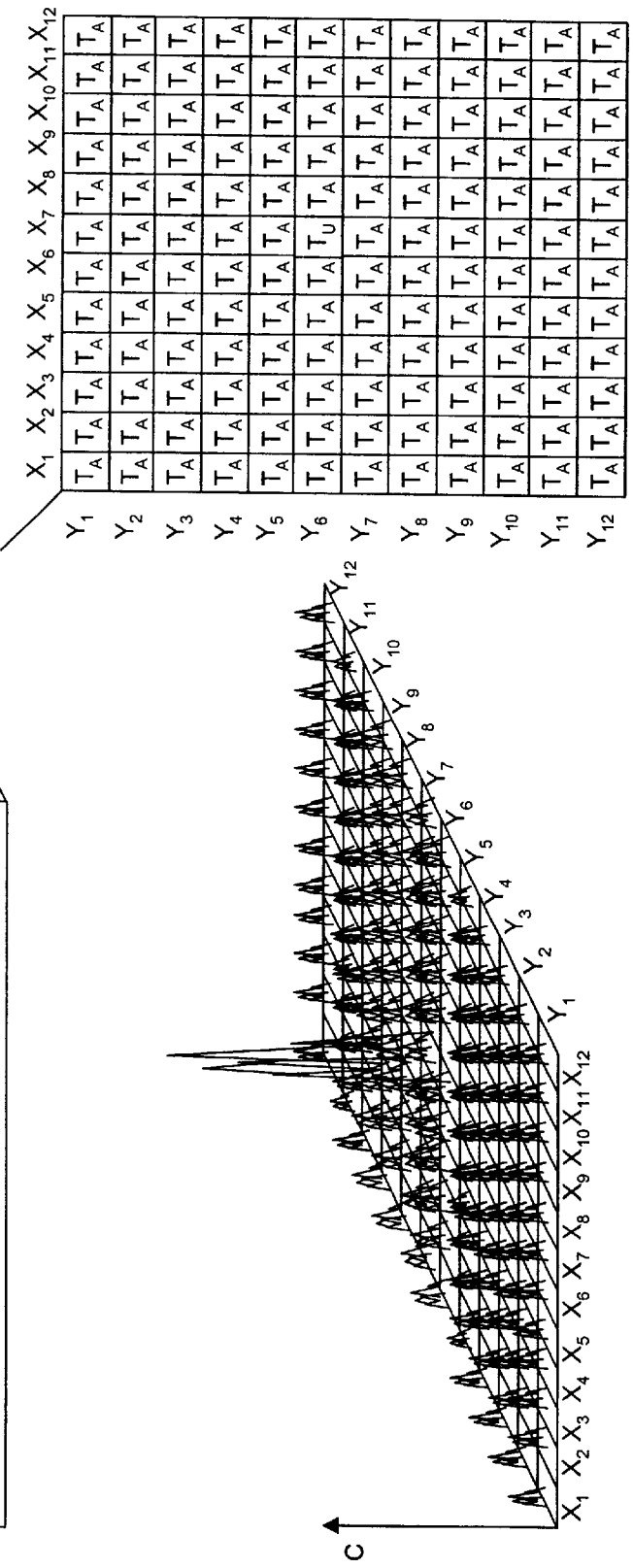
Fig. 11
Fig. 10

SURFACE NORMAL SPECULARLY REFLECTED BEAM

SENSOR TO PREDICT VOID FREE FILMS USING VARIOUS GRATING STRUCTURES AND CHARACTERIZE FILL PERFORMANCE

TECHNICAL FIELD

The present invention generally relates to reducing voids during metal processing in a semiconductor device. In particular, the present invention relates to characterizing a metal fill process and a metalization tool.

BACKGROUND ART

The use of and demand for semiconductor devices are increasing. Constant development of these devices requires constant improvements in size, performance and yield. These improvements are accomplished by improving the various processes used in semiconductor fabrication. Processes involving metal are often a challenge for sort yield and process control.

One process used in semiconductor fabrication is metalization. Metalization generally involves forming metal structures including metal layers, interconnects, conductive lines, contacts and plugs. These metal structures are vital to the function of semiconductor devices. The reliability, speed, and efficiency of semiconductor devices is directly linked to the quality of metal structures formed therein.

For example, some metalization processes involve depositing a metal in a trench or via. In many instances, the metal filled via or trench may also undesirably contain voids. Voids lower the conductivity of the metal structure, and thus deleteriously effect the speed and reliability of the semiconductor device. The voids result from poor fill performance. Poor fill performance is exacerbated by the continuing trend to decrease the size of semiconductor devices, and consequently, the size of metal structures therein. Attempting to fill trenches or voids of different sizes (dimensions) may lead to poor fill performance.

Referring to FIG. 1, a conventional metal fill process is shown illustrating the problem of void formation. On a semiconductor substrate 10 containing trenches 12, a metal material 11 is deposited. Often times, undesirable voids 16 form in the metal material 11 being deposited into the trenches 12 of the semiconductor substrate 10.

The high purity metal and metal sources intended for use in semiconductor fabrication are expensive. Wasting such metal, for example, by overfilling a trench or via, leads to increased costs as well as increased fabrication time to remove wasted metal from wafer substrates (by polishing, etching, and the like).

Poor fill performance is additionally or alternatively attributable to inconsistent tool performance. Wafer to wafer, day to day, week to week, and month to month toll performance unfortunately varies, sometimes negligibly, other times markedly. Tool variance results from extended use, poor maintenance, changes in environmental conditions, and the like.

SUMMARY OF THE INVENTION

The present invention provides systems and methods for improving metal fill performance and tool characterization. A standard calibration wafer containing at least one of vias or trenches of varying dimensions is fabricated. The standard calibration wafer is subjected to a metalization fill process, and using a sensor to monitor the process, it can be optimized. Specifically, the sensor facilitates characterizing the fill process, so that optimized parameters can be applied in the fabrication of a semiconductor device. Moreover, after removing the metal from the standard calibration wafer, repeated use of the standard calibration wafer in a metalization fill process can facilitate the characterization/calibration of the metalizing tool.

For example, a system can employ one or more light sources arranged to project light onto one or more features and/or gratings on a wafer, and one or more light sensing devices (e.g., photo detector, photodiode) for detecting light reflected and/or refracted by the one or more features and/or gratings. A grating is usually divided into a large number of sufficiently thin planar grating slabs to approximate an arbitrary profile. The light reflected from the one or more features and/or gratings is indicative of at least one parameter of the metalization processes (e.g., percent completion of a metal fill) that can be measured to determine whether desired fill or critical dimensions (CDs) have been achieved and to determine whether adaptations to the fill process should be undertaken in order to optimize the process.

As a result of the present invention, higher quality metal structures may be formed in semiconductor devices improving reliability, efficiency, and speed; a decreasing amount of valuable metal is wasted thereby improving costs associated with metalization; and tool characterization is enabled thereby improving consistency in wafer to wafer metalization. Specifically in relation to a metalization fill process, the present invention mitigates and/or eliminates the formation of voids and mitigates and/or eliminates overfilling vias and trenches.

One aspect of the invention relates to a metal fill process involving providing a standard calibration wafer having a plurality of fill features of known dimensions in a metalization tool; depositing a metal material over the standard calibration wafer; monitoring the deposition of metal material using a sensor system, the sensor system operable to measure one or more fill process parameters and to generate fill process data; controlling the deposition of metal material to minimize void formation using a control system wherein the control system receives fill process data from the sensor system and analyzes the fill process data to generate a feed-forward control data operative to control the metalization tool; and depositing metal material over a production wafer in the metalization tool using the fill process data generated by the sensor system and the control system.

Another aspect of the invention relates to a tool characterization process involving characterizing a metal fill process using a standard calibration wafer in a metalization tool; depositing metal material over another standard calibration wafer having the same dimensions as the standard calibration wafer in the metalization tool using the same fill process parameters; and comparing the fill process data of the other standard calibration wafer with the fill process data of the standard calibration wafer to characterize the metalization tool.

BRIEF DESCRIPTION OF DRAWINGS

FIG. 9 is a perspective illustration of a wafer upon which fill features that may be filled are located, in accordance with an aspect of the present invention.

FIG. 10 is a representative three-dimensional grid map of a wafer illustrating fill measurements taken in accordance with an aspect of the present invention.

FIG. 11 is a metalization measurement table correlating the fill measurements of FIG. 10 with desired values for the metal fills in accordance with the present invention.

DISCLOSURE OF INVENTION

Figure 1:
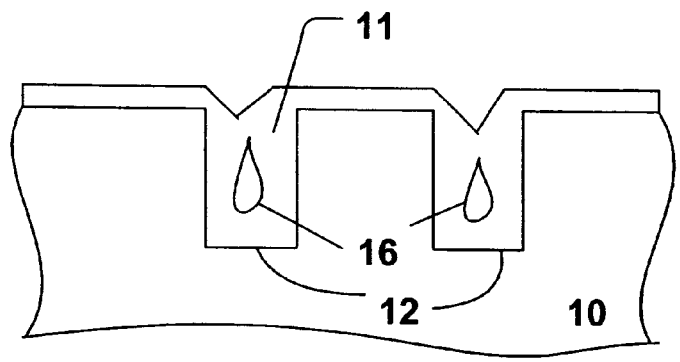
FIG. 1 is a cross-sectional view of a conventional metalization process.

The systems and methods for improving metal fill performance generally involve characterization of the filling process. A standard calibration wafer containing fill features of varying dimensions is monitored during a fill process thereby creating fill data. Using the standard calibration wafer, the fill process can be continuously or intermittently monitored. If necessary, the fill process may be stopped to correct defects, for example, if voids are detected, specific steps are taken to fill the voids. In the particular instance where an electroplating process is employed, when voids are detected the potential may be reversed to etch or remove some metal and then the area may be re-metalized or filled so that it is free of voids. Optimum conditions and parameters can be determined (characterization or mapping of the fill process) and employed so that a metalization tool can be efficiently used to consistently metalize wafers in a manufacturing setting. Characterization of optimal fill processes using the standard calibration wafer enables one to tailor a subsequent fill processes according to dimensions of the fill features on the production wafers. In other words, the fill data generated using the standard calibration wafer is used by a control system to efficiently and reliably perform metal fill operations in production wafers. The production wafers may be metalized with or without a sensing system, such as scatterometry, to monitor the metalization process.

Using the standard calibration wafer to characterize filling processes on various sized/spaced fill features permits one to optimize filling processes on production wafers before actually starting the filling processes. Processing the standard calibration wafer containing various sized/spaced fill features enables one to encounter problems with a proposed fill process, modify the proposed fill process, and then subsequently efficiently perform metalization on production wafers with minimal down time and/or minimal rework time.

Repeated use of the standard calibration wafer in a metalization fill process facilitates the characterization/calibration of the metalizing tool. The tool is any device that can form a metal structure (such as a metal layer, or deposit metal in a fill feature). The tool is typically a furnace, chemical vapor deposition chamber, physical vapor deposition chamber, electroplating device, electroless plating device, and the like. Since the standard calibration wafer has fill features having known dimensions, and since optimum conditions for filling or metalizing these features is known, characterization of the metalizing tool becomes possible by evaluating the subsequent fill process using the standard calibration wafer. This is advantageous because the metalization tool may not function consistently over time.

Metalizing involves the deposition or formation of a layer of metal structures in fill features. Metal structures include aluminum, copper, chromium, hafnium, gold, nickel, palladium, platinum, silver, tantalum, titanium, tungsten, zinc, zirconium, alloys thereof, silicides thereof, nitrides thereof (such as barrier layers), and the like. Fill features generally include openings that filled with metal material such as vias, trenches, interconnect openings, dual damascene openings, and the like.

The following is a detailed description of the present invention made in conjunction with the attached figures, wherein like reference numerals will refer to like elements throughout.

Figure 2:
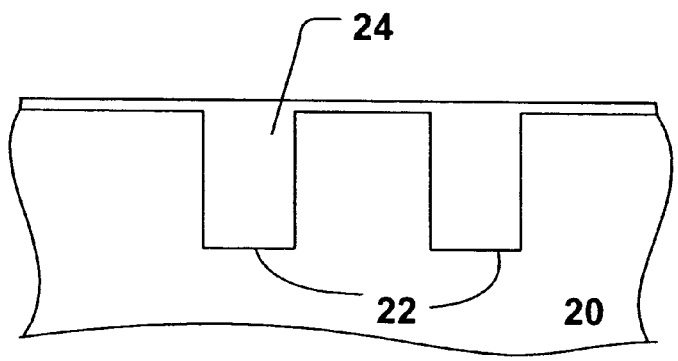
FIG. 2 is a cross-sectional view of a metalization process in accordance with an aspect of the present invention.

Referring to FIG. 2, the results of employing the present invention are shown. A semiconductor substrate 20 having fill features 22, such as vias or trenches, is filled with a metal material 24 without the undesirable formation of voids in the metal material 24. Moreover, the amount of metal material 24 above the substrate 20 that is not within the fill features 22 is minimized, thereby reducing the amount of metal material typically required in a metalization process.

Figure 3:
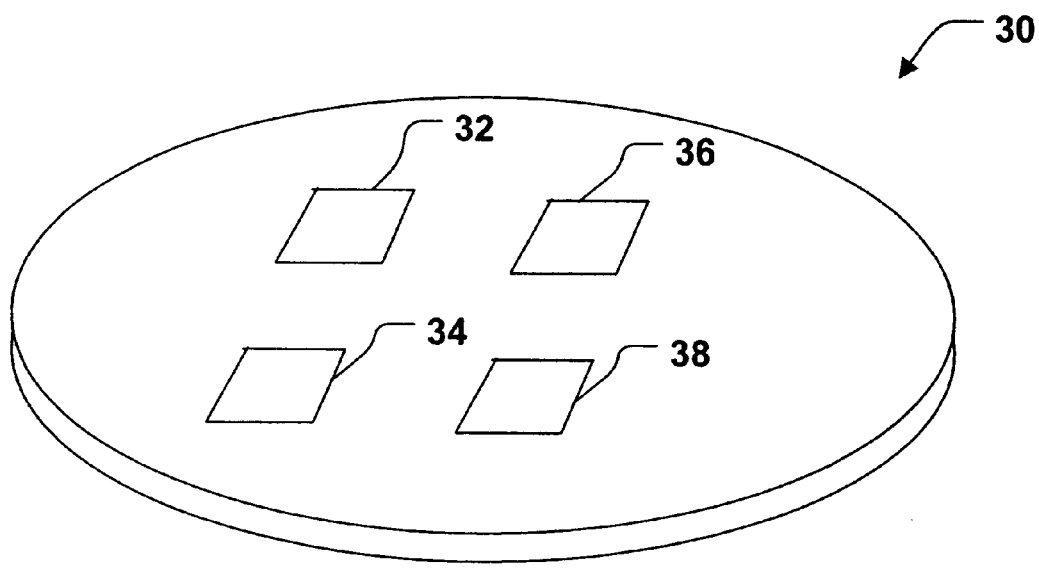
FIG. 3 is a top view of a standard calibration wafer in accordance with one aspect of the present invention.

Referring to FIG. 3, a standard calibration wafer 30 is shown. The standard calibration wafer 30 is made of a substrate (typically quartz, monocrystalline silicon, and the like), and may contain no further layers or any number of additional layers. The additional layers can be made of any material commonly employed in making semiconductor devices, such as silicon containing materials dielectric materials, and the like. The standard calibration wafer 30 contains at least one via or trench, preferably a region of vias or trenches 32, and more preferably a plurality of vias and trenches 34, 36, and 38.

Each area 32, 34, 36, and 38 may contain fill features having different dimensions or the same dimensions. In instances where the fill features of one of the areas have the same dimensions, then another area may have fill features of a different dimension. For example, area 32 may contain trenches that have a depth of 0.3 $\mu$m and a width of 0.25 $\mu$m; area 34 may have on set of vias having a depth of 0.2 $\mu$m and a width of 0.18 $\mu$m and a second set of vias having a depth of 0.3 $\mu$m and a width of 0.2 $\mu$m; area 36 may have trenches that have a depth of 0.4 $\mu$m and a width of 0.25 $\mu$m vias having a depth of 0.25 $\mu$m and a width of 0.18 $\mu$m; and area 38 may have dual damascene features where the trench regions have a depth of 0.2 $\mu$m and a width of 0.3 $\mu$m while the via regions have a depth (including trench depth) of 0.35 $\mu$m and a width of 0.15 $\mu$m.

Figure 4:
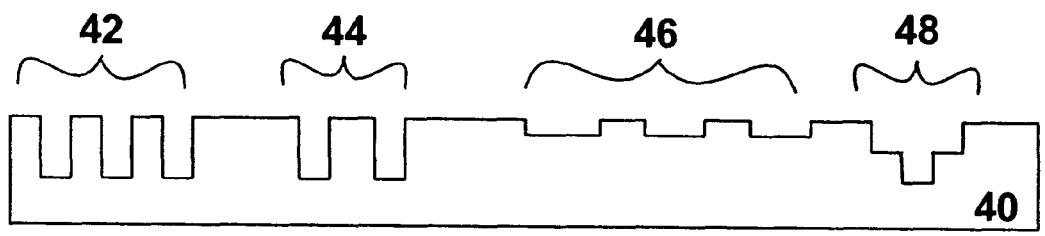
FIG. 4 is a cross-sectional view of a standard calibration wafer in accordance with another aspect of the present invention.

Referring to FIG. 4, another example of a standard calibration wafer 40 is shown, but from a cross-sectional perspective. Standard calibration wafer 40 contains four areas of fill features 42, 44, 46, and 48. Alternatively, the standard calibration wafer 40 may have one, two, three, five, six, or any amount of areas of fill features that can be formed on a wafer. Area 42 contains deep, narrow vias in close proximity (high density), area 44 contains a medium density of deep narrow vias, area 46 contains wide, shallow trenches, and area 48 contains dual damascene structures. Each of these fill features will have different fill characteristics, and filling each with a metal material while mitigating void formation is facilitated by the present invention.

The fill features are formed using known techniques in the standard calibration wafer 30 by additive and/or subtractive processes, typically involving lithography. The particular shapes and dimensions of the fill features of each or any region are not critical to the invention.

Figure 5:
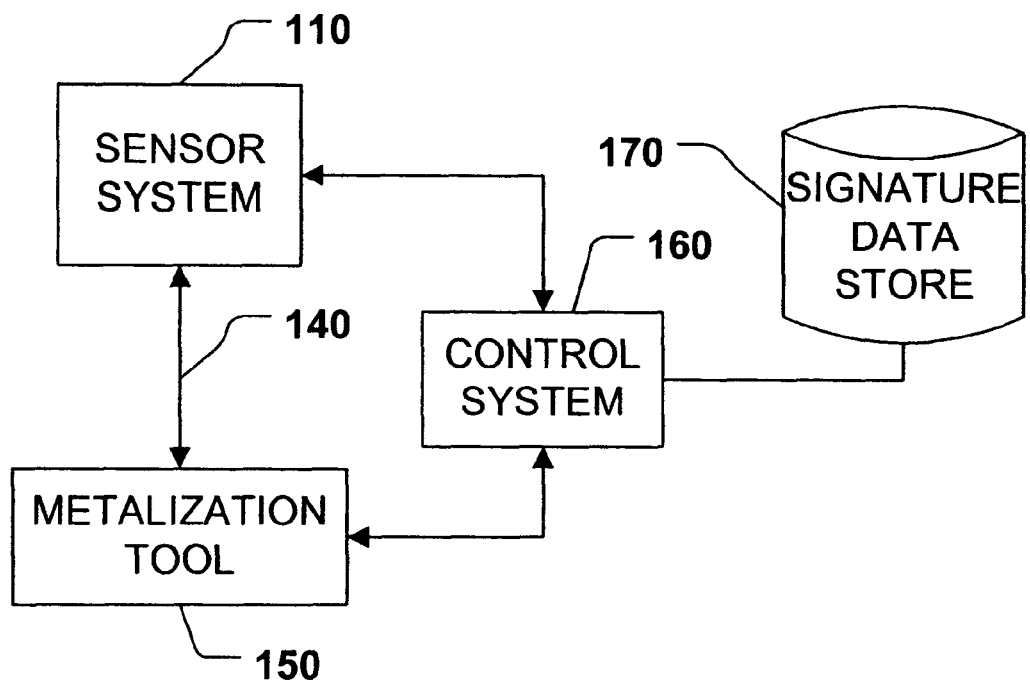
FIG. 5 is a high level schematic block diagram of a system for characterizing a metalization process in accordance with an aspect of the present invention.

Referring to FIG. 5, a block diagram of a system 100 for monitoring and/or controlling metalization fill process is illustrated. The metalization can be operated by a metalization tool 150. By way of illustration, the metalization tool 150 such as an electroplating device is able to deposit metal into fill features of various shapes, depths, profiles and widths in the standard calibration wafer. General metalization procedures are known in the art.

The system 100 also includes a sensor system 110 operable to measure the shape, depth, CD, profile and/or width of the fill features in the standard calibration wafer. The sensor system 110 includes, for example, a light source that emits a beam 140 incident to the surface of the standard calibration wafer. The beam 140 interacts with the standard calibration wafer and the fill features (and any metal therein) in the standard calibration wafer and thus is reflected and/or diffracted. The sensor system 110 also includes a detection system for detecting the reflected and/or diffracted light (also indicated as 140 for purposes of brevity). Characteristics (e.g. shape, profile, CD, depth, width) of the fill features are determined based on the properties of the reflected and/or diffracted light 140. The system 100 also includes a control system 160 operatively coupled to the metalization tool 150 and the sensor system 110. The control system 160 is programmed and/or configured to control operation of the metalization tool 150. Other metal fill fabrication parameters including, but not limited to feature fill rate, potential (especially in electroplating), critical dimensions, surface profile, planar uniformity, and the like may also be monitored. Some or all of the parameters, especially CDs, fill depth, and fill feature profile change over the course of metalization, and the sensor system 110 detects these changes.

It is to be appreciated that the surface of the standard calibration wafer, which includes features on and/or in the standard calibration wafer being processed, can both reflect and refract the light 140, so that the resulting light 140 can be a complex reflected and/or refracted light. It is to be further appreciated that although the light 140 is illustrated being directed at one side of the standard calibration wafer, that the light 140 may be directed at either and/or both sides of the standard calibration wafer. The scatterometry and/or reflectometry analysis can include comparing one or more scatterometry and/or reflectometry signatures associated with the reflected light 140 to one or more scatterometry and/or reflectometry signatures stored in a signature data store 170. Such signatures may be generated, for example, by combining phase, polarization and/or intensity information associated with the reflected light.

As fabrication progresses, light reflecting from the standard calibration wafer may produce various signatures. The sequence in which such signatures are generated can be employed to determine the rate at which metal fill (metalization) is progressing and also to predict times when metalization may be substantially completed and/or times when an ex-situ quality control analysis may be appropriate. For example, at a first point in time T1, light reflected from the standard calibration wafer may produce a signature S1 that indicates that openings (e.g., fill features) with a first width W1 and depth D1 exist and that a test grating should be probed at a second point in time T2 and a third point in time T3. Thus, at the second point in time T2, light reflected from the standard calibration wafer may produce a signature S2 that indicates that fill features with a second width W2 and depth D2 exist and at a third point in time T3, light reflected from the standard calibration wafer may produce a signature S3 that indicates that fill features with a third width W3 and depth D3 exist. Analyzing the sequence of signatures, and the time required to produce transitions between such signatures can facilitate determining whether metalization is progressing at an acceptable rate, can facilitate predicting optimal times to pause a metalization process to probe the metalization process and can facilitate determining when metalization should be terminated. Feedback information can be generated from such sequence analysis to maintain, modify, reverse, increase and/or decrease the rate at which metalization processes (e.g., feature fill) progresses. For example, the power during sputtering and/or concentrations can be altered to affect the fill rate based on the signature sequence analysis.

The signature data can be stored in data structures including, but not limited to one or more lists, arrays, tables, databases, stacks, heaps, linked lists and data cubes. The signature data store 170 can reside on one physical device and/or may be distributed between two or more physical devices (e.g., disk drives, tape drives, memory units). Analyses associated with the reflected light and/or the signatures stored in the signature data store 170 can be employed to control one or more metalization parameters (e.g., power, potential, concentration, critical dimensions, potential, surface profile, time, angle) and in the present invention can be employed to terminate, reverse, and/or pause metalization, for example.

One characteristic of the standard calibration wafer is that the metalization characteristics of each fill feature are different. For example, metalization characteristics include position of the fill feature on the standard calibration wafer, the depth of the fill feature, the width of the fill feature, the shape of the fill feature, the density of fill features in a given region, the type of metal deposited in the fill feature, the fill rate of the metal, concentration, critical dimensions, surface profile, atmosphere, power and other features associated with the deposition of the metal in the fill feature, and the like.

By monitoring the fill process, optimized fill data for each fill feature of the standard calibration wafer is generated, stored in a data store, and subsequently available so that a control system may employ the fill data in metalizing production wafers without the need for optimization.

Figure 6:
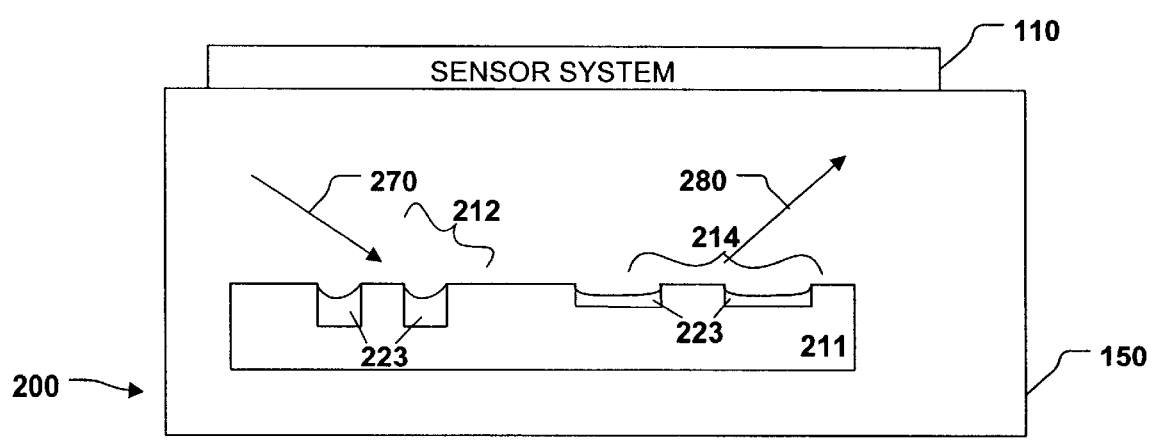
FIG. 6 is a cross-sectional view of a wafer being metalized and characterized in accordance with an aspect of the present invention.

Referring to FIG. 6, a metalization monitoring system 200 with a sensor system 110 is illustrated directing a light 270 at standard calibration wafer 211 and receiving back a reflected light 280. The metalization monitoring system 200 can be a standalone device and/or can also be distributed between two or more cooperating devices and/or processes. The metalization monitoring system 200 can reside in one physical or logical device (e.g., computer, process) and/or be distributed between two or more physical or logical devices. The metalization monitoring system 200 may include one or more components that are located inside a metalization chamber 150 and/or one or more components that are not located inside the chamber 150.

The reflected light 280 is affected by parameters including, but not limited to the chemical properties of the standard calibration wafer 211 and/or the layers on the wafer 211, the size, shape, depth and location of fill features on the wafer 211, the size, shape, depth and location of metal fill 223 on the wafer 211 and the size, shape and location of spaces between such features. By way of illustration, different sized fill features may have different depths/widths that affect the reflected light 280. By way of further illustration, feature fill area 212 with relatively deep, narrow vias and feature fill area 214 with relatively wide, shallow trenches are illustrated. Each of the fill features is illustrated as partially containing metal 223. The metalization tool 150 is operatively connected to the sensor system 110. The metalization tool 150, which may be one or more of a variety of components known in the art can be employed to deposit metal into the fill features, to control deposition parameters, and the like, which in turn facilitates more precisely filling the fill features of the standard calibration wafer 211. Thus, the fill features are filled with metal 223 as a result of the metalization processes associated with the metalization tool 150.

The rate at which the fill features are filled and the amount of metal fill 223 in each of the fill features can be measured by the sensor system 110 to determine whether desired metalization is achieved on the standard calibration wafer 211. For example, a signature associated with amount of metal fill 223 in a fill feature may indicate that further metal deposition by the metalization tool 150 may be required. Thus, information operable to control the metalization tool 150 and the metalization process may be generated by the metalization monitoring system 200 and/or sensor system 110.

As filling of the fill features progresses, light reflecting from the standard calibration wafer 211, the metal fill 223, and/or the fill features may produce various signatures. The sequence in which such signatures are generated can be employed to determine the rate at which metalization is progressing and determine if undesirable voids are created. Similarly, the sequence of such signatures may be employed to determine the rate at which a given fill feature is filling. Such changes in rates can be employed to determine completion times, for example, and thus can be employed to facilitate scheduling subsequent metalization processes.

By way of illustration, at a first point in time T5, light reflected from the standard calibration wafer 211, the metal fill 223, and/or the fill features may produce a signature S5 that indicates that the fill feature has reached a first measurement. Similarly, at a second point in time T6, light reflected from the standard calibration wafer 211, the metal fill 223, and/or the fill features may produce a signature S6 that indicates that the fill feature has reached a second measurement and at a third point in time T7, light reflected from the standard calibration wafer 211, the metal fill 223, and/or the fill features may produce a signature S6 that indicates that the fill feature has reached a third desired measurement, and that metalization should conclude. Analyzing the sequence of signatures, and the time required to produce transitions between such signatures can facilitate determining whether metalization is progressing at an acceptable rate and that voids are created. Feedback information can be generated from such sequence analysis to maintain, modify, increase and/or decrease the rate which metalization progresses by, for example, manipulating power, deposition rate, and concentrations, etc, while minimizing void formation.

Figure 7:
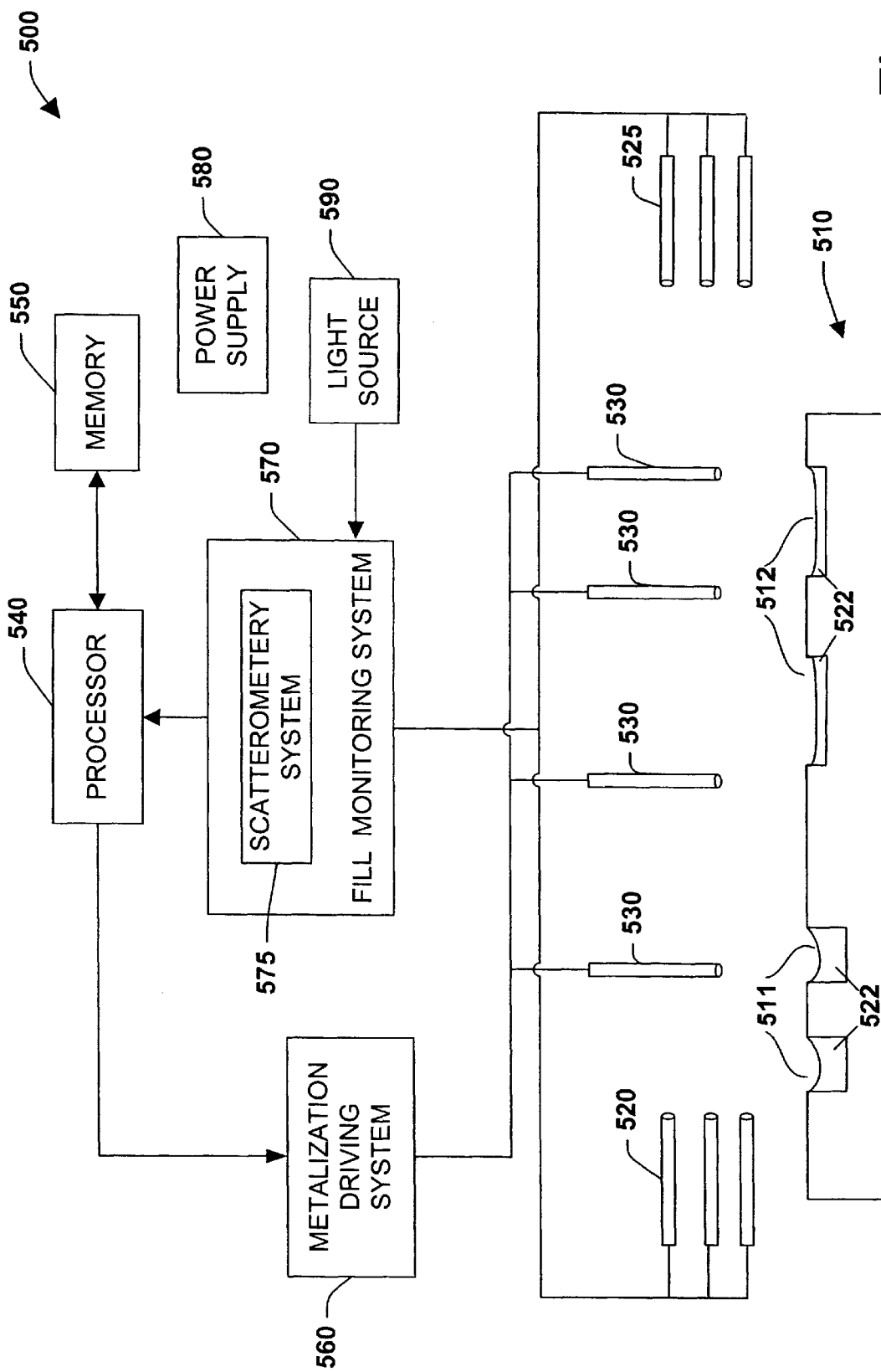
FIG. 7 is schematic block diagram of a metalization process fill monitoring and controlling system in accordance with an aspect of the present invention.

FIG. 7 illustrates a system 500 for monitoring and controlling a metalization processes. The system 500 operates to control one or more metalization components 530 in order to optimize metalization processes and to mitigate forming air voids and fabricating poorly formed metal structures. A fill monitoring system 570, a processor 540 and a metalization driving system 560 work cooperatively to control the metalization components 530.

The metalization components 530 are coupled to and controlled directly by the metalization driving system 560. The metalization driving system 560 receives information and/or instructional commands from the processor 540. The processor 540 determines the content and type of information transmitted to the metalization driving system 560 according to its analysis of data received from and collected by the fill monitoring system 570. Thus, through the interaction of components 530, 570, 540 and 560, the system 500 has the ability to improve subsequent metalization processes for the same wafer and/or for subsequent wafers. Such interaction between the components 530, 570, 540 and 560 also facilitates customizing a metal fill process to wafers with different densities/shapes/sizes of features, providing an improvement over conventional systems. In addition, by communicating measurements relating to recently filled features to the processor 540, the processor 540 can control the metalization driving system 560, which can thus regulate the one or more metalization components 530 to facilitate obtaining more precise, less void containing, and improved metalization processes. In one example of the present invention, such control may be adapted over time by various machine learning techniques. Thus trimming errors can be mitigated and higher packing densities and smaller feature sizes can be achieved.

Especially after optimizing the metalization process on the standard calibration wafer 510, data in the memory can be employed to perform high quality metalizations on wafers containing components for commercial devices, thereby improving overall fabrication and yield.

The system 500 includes one or more metalization components 530 that are selectively controlled to facilitate controlled filling of metal into vias and trenches in the standard calibration wafer 510. One or more target light sources 520 project light onto respective portions of the wafer 510. A portion of the wafer 510 may have one or more vias 511, trenches 512, metal fill 522, and/or other features located on that portion. Light reflected and/or refracted by the one or more features is collected by one or more light detecting components 525, and processed by a fill monitoring system 570 to measure at least one parameter relating to the metalization of one or more fill features 511, 512 and/or the one or more metal fills 522. For example, the depth in via 511 and the depth of trench 512 can be measured and compared to desired fill levels. Additionally, a determination of the presence of voids in metal fills 522 can also be made. The reflected light is measured with respect to the incident light in order to obtain the various parameters relating to the features (fill features 511, 512 and/or the one or more metal fills 522).

The fill monitoring system 570 includes a scatterometry system 575. It is to be appreciated that any suitable scatterometry system may be employed to carry out the present invention, and such systems are intended to fall within the scope of the claims appended hereto.

A light source 590 (e.g., a laser) provides light to the one or more target light sources 520 via the fill monitoring system 570. Preferably, the light source 590 is a frequency-stabilized laser, however, it will be appreciated that any laser or other light source (e.g., laser diode or helium neon (HeNe) gas laser) suitable for carrying out the present invention may be employed. One or more light detecting components 525 (e.g., photo detector, photo diodes) collect light reflecting from the one or more features (fill features 511, 512 and/or the one or more metal fills 522). The fill monitoring system 570 may also process the measured light data into a data form compatible with or understandable to the processor 540.

The processor 540 is operatively coupled to the fill monitoring system 570 and receives the measured trim parameter data from the fill monitoring system 570. The processor 540 determines the acceptability and/or progress of the metalization of the respective portions of the standard calibration wafer 510 by examining measured metal fills 522, monitoring, analyzing and storing acceptable and unacceptable fill values. The fill values augment the one or more signatures stored, for example, in a memory 550. In determining the acceptability and/or progress of an on-going and/or recently completed metalization process, the processor 540 may also determine to what extent, if any, adjustments to the metalization components 530 are necessary to optimize subsequent metalization processes. Upon making the determination, the processor 540 transmits this information to the metalization driving system 560, which then makes one or more adjustments to the metalization components 530.

The fill monitoring system 570 facilitates the characterization of metalization of a variety of shapes, sizes, feature density, widths, etc. of fill features, as well as a variety of pcess parameters such different powers, concentrations and so on, which then permits one to optimize any subsequent metalization process.

As described above, the processor 540 is also coupled to the metalization driving system 560 that directs and controls the one or more metalization components 530. The metalization driving system 560 is controlled, at least in part, by the processor 540 to selectively vary the operation of the respective metalization components 530. Each respective portion of the standard calibration wafer 510 is associated with a corresponding metalization component 530. The processor 540 monitors the trimming of one or more features (such as fill features 511, 512 and/or the one or more metal fills 522), and selectively regulates the metalization of each portion via the corresponding metalization components 530. The transmission and relay of information between the fill monitoring system 570, the processor 540, the metalization driving system 560 and the metalization components 530 creates effective feed back control that facilitates improving fill quality by producing more precisely filled vias and trenches which in turn facilitates producing more precisely sized and/or shaped features.

The processor 540, or central processing unit, may be any of a plurality of processors, such as the AMD K7, the AMD Athlon and other similar and compatible processors. The processor 540 is programmed to control and operate the various components within the system 500 in order to carry out the various functions described herein. The manner in which the processor 540 is programmed to carry out the functions relating to the present invention will be apparent to those having ordinary skill in the art based on the description provided herein.

A memory 550, which is operatively coupled to the processor 540, is also included in the system 500 and serves to store, among other things, program code executed by the processor 540 for carrying out operating functions of the system 500 as described herein. For example, the memory 550 can hold fill data to which observed data can be compared. The memory 550 also serves as a storage medium for temporarily storing metalization parameter data such as fill progress values, metalization progress tables, component coordinate tables, fill feature sizes, fill feature shapes, fill feature density, location of fill feature on wafer, identity of metal deposited, scatterometry information, and other data that may be employed in carrying out the present invention.

A power supply 580 provides operating power to the system 500. Any suitable power supply (e.g., battery, line power) may be employed to carry out the present invention.

Figure 8:
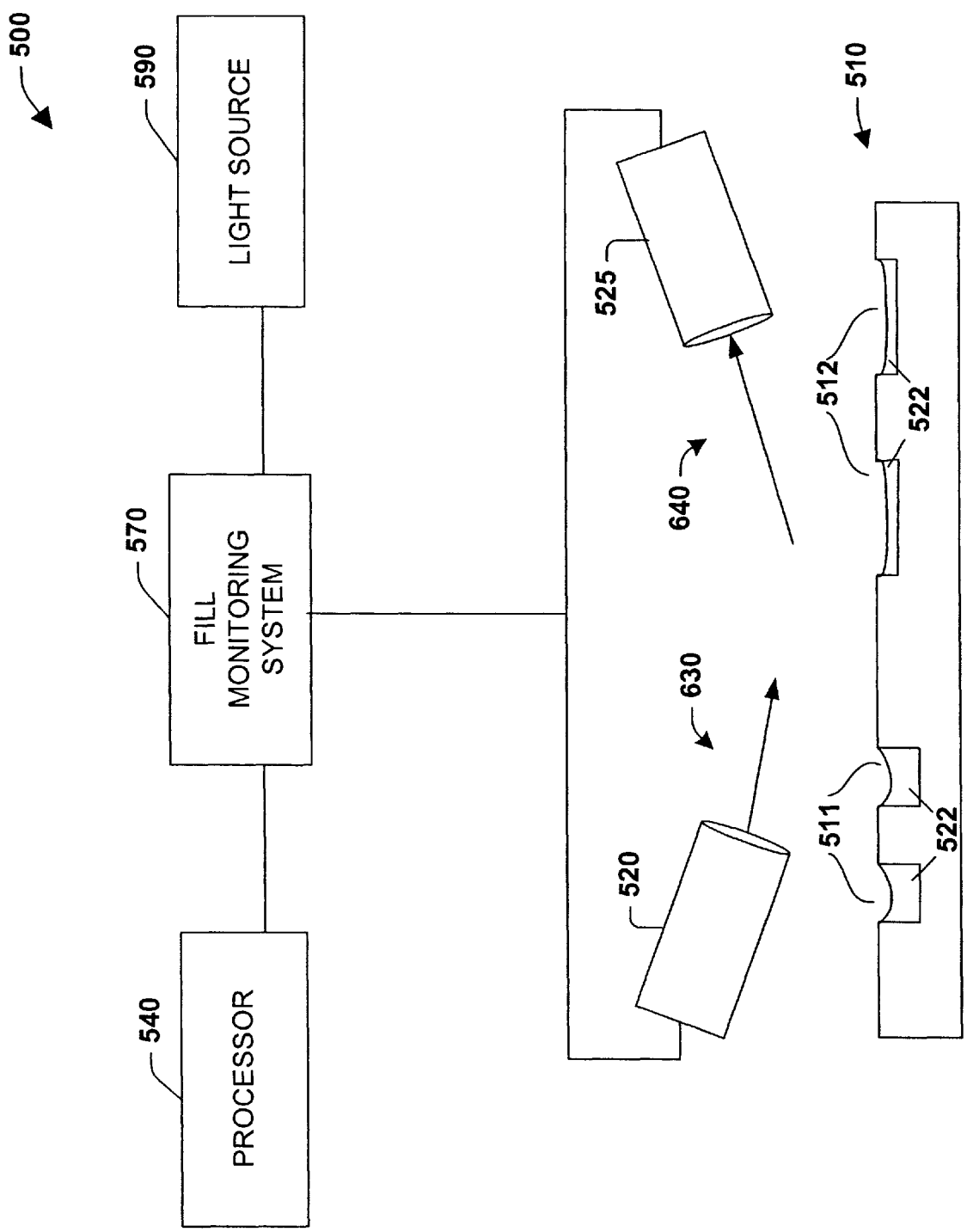
FIG. 8 is a partial schematic block diagram of the system of FIG. 7 being employed in connection with determining metalization progress by measuring fill features in accordance with an aspect of present invention.

Turning now to FIG. 8, one aspect of the present invention is shown. FIG. 8 illustrates the system 500 being employed to measure the metalization of a particular portion of the standard calibration wafer 510. The target light source 520 directs a light 630 incident to the surface of the wafer 510. The angle of a light 640 reflected from the surface of the wafer 510 will vary in accordance with the evolving dimensions of fill features 511, 512, and/or with the evolving characteristics (e.g., thickness, planarity) of one or more metal fills 522 being formed on the wafer 510. The one or more light detecting components 525 collect the reflected light 640 and transmit the collected light, and/or data associated with the collected light, to the fill monitoring system 570. The fill monitoring system 570 collects the reflected light 640, and/or related data, in accordance with scatterometry techniques. The fill monitoring system 570 then provides the processor 540 with the data corresponding to the metalization characteristics associated with the wafer 510. The data may include, for example, information relating to the dimensions of filled areas 511 relative to, or independent of, dimensions of other filled areas 512, and/or surface characteristics as well as other measurements relating to the metalization process.

In another aspect of the invention, the data may also include conclusory information including, but not limited to, whether desired dimensions have been reached and whether metalization should continue, whether voids have been formed and thus whether adjustments are required and whether measured fill dimensions are within a pre-determined range.

The fill monitoring system 570 provides direct, real-time measurements to the processor 540, as opposed to measurements taken according to pre-determined system schedules and measurements taken post-fabrication. Providing direct, real-time feedback to the processor 540 facilitates selective control of metalization processes and improved metalizing precision over conventional methods and/or apparatus.

Turning now to FIGS. 9–11, another aspect of the present invention is shown. In addition to the methods described above, a standard calibration wafer 710 may be logically partitioned into grid blocks to facilitate determining positions or locations where the standard calibration wafer 710 may benefit from adjusting one or more metalization processes. Obtaining such positions or locations may facilitate determining to what extent, if any, and when, if at all, metalization process parameter adjustments are necessary. Obtaining such information may also assist in determining problem areas associated with metalization processes.

FIG. 9 illustrates a perspective view of a chuck 730 supporting the standard calibration wafer 710, whereupon one or more gratings may be formed. The wafer 710 may be divided into a grid pattern as shown in FIG. 10. Each grid block (XY) of the grid pattern corresponds to a particular portion of the standard calibration wafer 710, and each grid block is associated with one or more features (fill features 511, 512). The grid blocks are individually monitored for metalization process parameters and metalizing may be individually controlled for each grid block. It is to be appreciated that the size and/or shape of gratings can be manipulated to facilitate analyzing different aspects of the fill process. For example, for a particular integrated circuit, a measurement relating to the CD or a depth of a feature may be important. Thus, the gratings can be patterned to optimize analyzing CDs and/or the depth of a feature.

In FIG. 10, one or more gratings in the respective portions of the standard calibration wafer 710 ($X_1Y_1 \ldots X_{12}, Y_{12}$) are monitored for CDs or depths of fill features 511 and 512 during the metalization process using reflected light, the fill monitoring system 570 (FIG. 7) and the processor 540 (FIG. 7). Exemplary CD and depth measurements produced during metalizing for each grating are shown. As can be seen, the depth measurement at coordinate $X_7Y_6$ is substantially higher than the depth measurement of the other portions XY. This may indicate the presence of a void or over fill. It is to be appreciated that the wafer 710 may be mapped into any suitable number of grid blocks, and any suitable number of fill features may formed on the wafer 710. Although the present invention is described with respect to one metalization component 530 corresponding to one grid block XY, it is to be appreciated that any suitable number of metalization components 530 corresponding to any suitable number of wafer portions/grid blocks may be employed.

FIG. 11 is a representative table of CD and depth measurements taken for the various grid blocks that have been correlated with acceptable CD and depth values for the portions of the wafer 710 mapped by the respective grid blocks. As can be seen, all the grid blocks, except grid block $X_7Y_6$, have depth measurements corresponding to an acceptable CD or depth table value ($T_A$) (e.g., are within an expected range of trimming measurements), while grid block $X_7Y_6$ has an undesired CD or depth table value ($T_U$). Thus, the processor 540 has determined that an undesirable metalization condition exists at the portion of the wafer 710 mapped by grid block $X_7Y_6$. Accordingly, the processor 540 can drive at least a metalization component $530_{7,6}$, which corresponds to the portion of the wafer 710 mapped at grid block $X_7Y_6$, to attempt to produce an acceptable CD or depth. It is to be appreciated that the metalization components 530 may be driven so as to maintain, increase, and/or decrease, the rate of filling of the respective fill features of the wafer 710 as desired, or even remove metal material by, for example, reversing the potential during electroplating. In one example of the present invention, the metalization component 530 associated with grid block $X_7Y_6$ may change the power associated with the grid block and/or the concentration of the active ingredients of a metal associated with the grid block. When the processor 540 determines that the metalization process has reached a pre-determined threshold level, the processor 540 may terminate the metalization by one or more metalization components 530, thus enabling more precise control of the metal filling process, which provides advantages over conventional systems. Data generated from the different fill features from various gratings projected on the standard calibration wafer is then used to perform void free fill operations on production wafers, with or without the assistance of a monitoring system.

Figure 12:
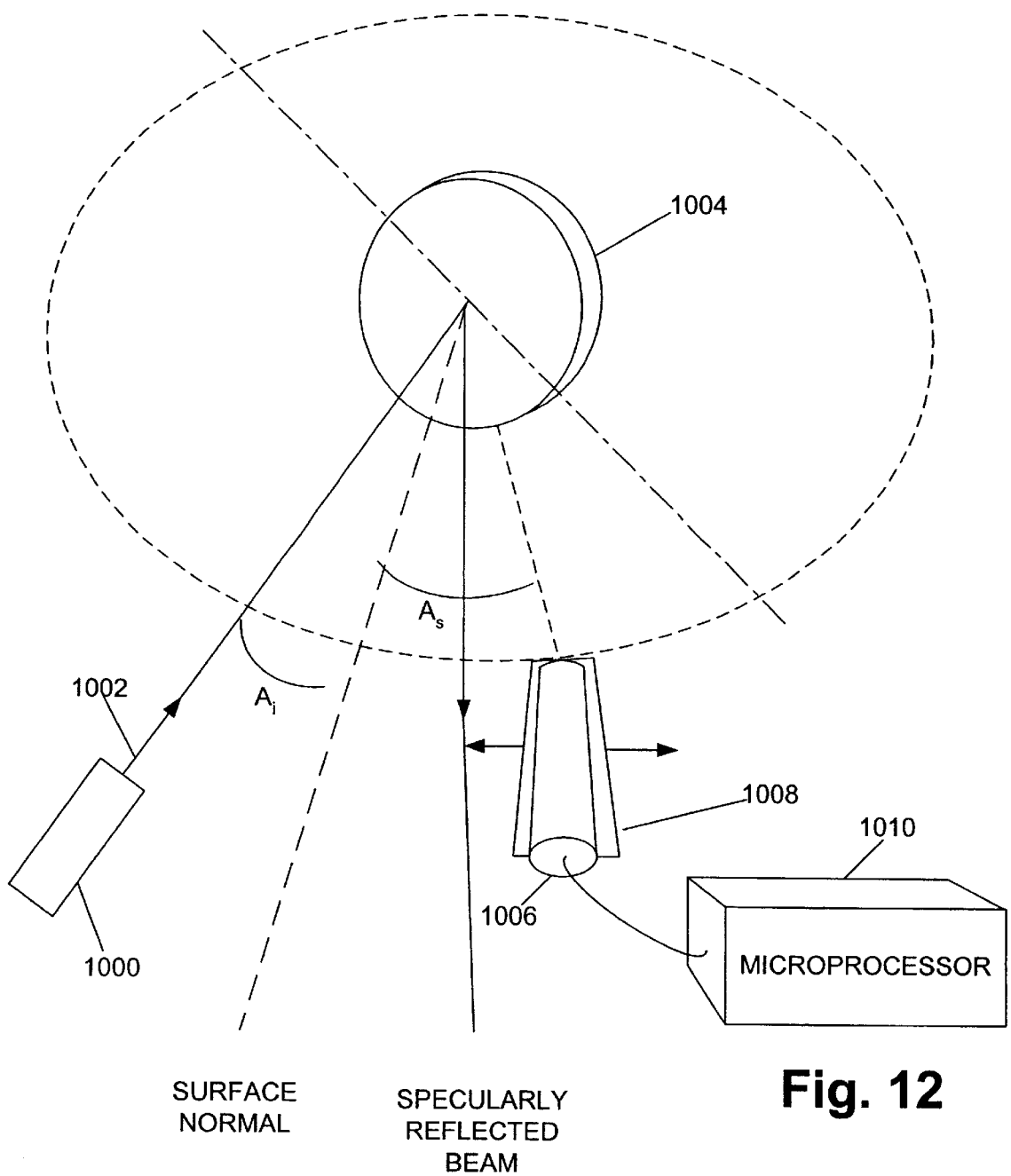
FIG. 12 illustrates an exemplary scatterometry system collecting reflected light.

FIG. 12 illustrates an exemplary scatterometry system collecting reflected light. Light from a laser 1000 is brought to focus in any suitable well-known manner to form a beam 1002. A sample, such as a standard calibration wafer 1004, is placed in the path of the beam 1002 and a photo detector or photo multiplier 1006 of any suitable well-known construction. Different detector methods may be employed to determine the scattered power. To obtain a grating pitch, the photo detector or photo multiplier 1006 may be mounted on a rotation stage 1008 of any suitable well-known design. A microprocessor 1010, of any suitable well-known design, may be used to process detector readouts, including, but not limited to, angular locations of different diffracted orders leading to diffraction grating pitches being calculated. Thus, light reflected from the sample 1004 may be accurately measured.

Figure 13:
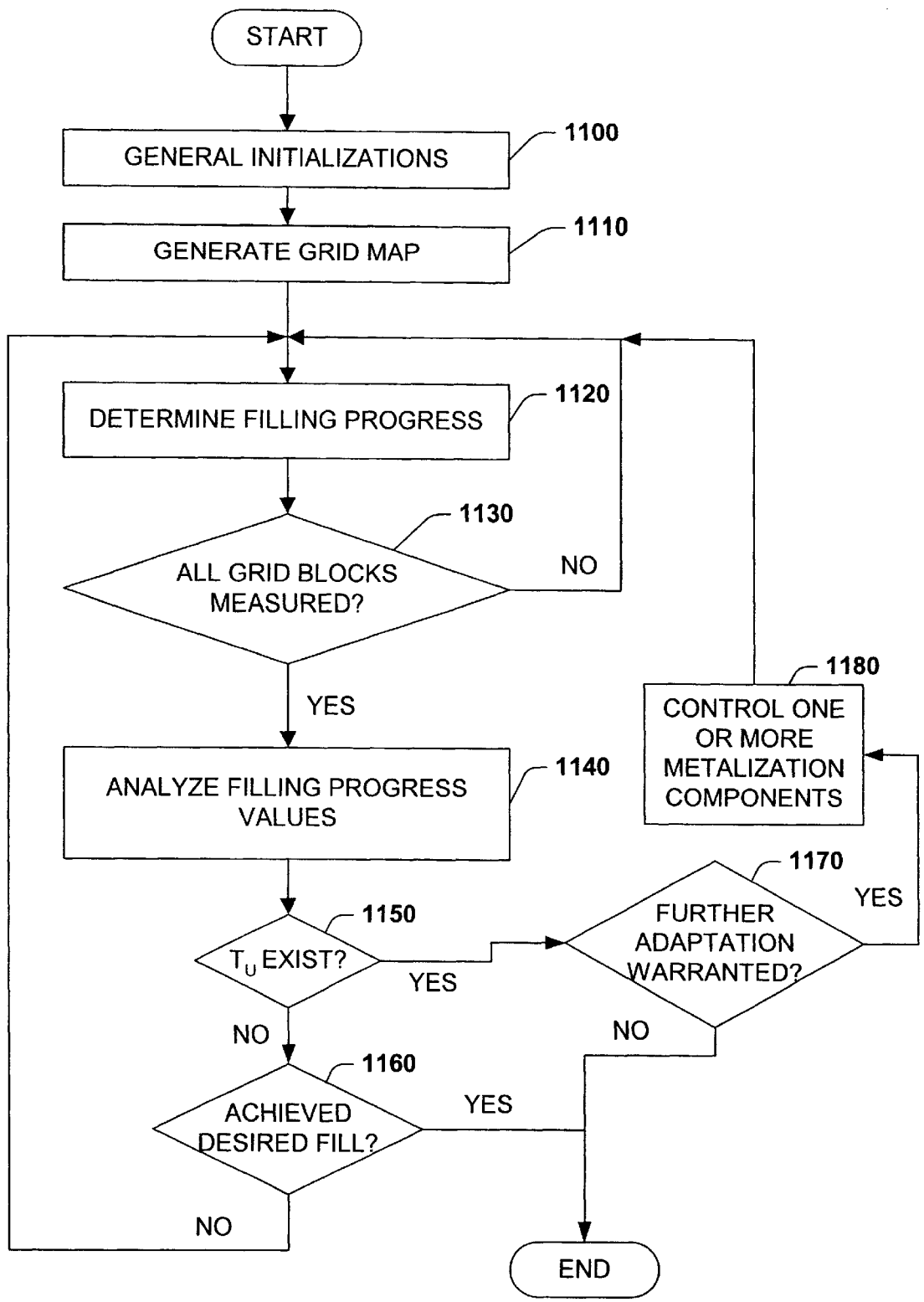
FIG. 13 is a flow diagram illustrating one specific methodology for carrying out the present invention.

In view of the exemplary systems shown and described above, methodologies that may be implemented in accordance with the present invention will be better appreciated with reference to the flow diagram of FIG. 13. While for purposes of simplicity of explanation, the methodology of FIG. 13 is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 13 is a flow diagram illustrating one particular methodology for carrying out the present invention. At 1100, general initializations are performed. Such initializations can include, but are not limited to, establishing pointers, allocating memory, setting variables and establishing communication channels. At 1110, a grid map of a plurality of grid blocks "XY" is created. At 1120, metalization or filling determinations are made with respect to the various wafer portions mapped by the respective grid blocks XY. At 1130, a determination is made concerning whether all grid block measurements have been taken. If the determination at 1130 is NO, then processing returns to 1120. If the determination at 1130 is YES, then at 1140, determined dimension values are analyzed and compared against acceptable depths (or other comparative indicia) for the respective portions of a wafer. In an alternative example of the present invention, the determination at 1130 may concern whether a sufficient number of grid blocks have been measured to facilitate valid depth analysis.

At 1150, a determination is made concerning whether filling values are not acceptable. If filling values are acceptable, then processing continues at 1160 where a determination is made concerning whether desired filling values have been achieved. If a desired fill has been achieved, then processing can conclude. Otherwise, processing continues at 1120. If unacceptable dimension values are found at 1150, processing proceeds to 1170 where a determination is made concerning whether further adaptation is warranted. By way of illustration, the unacceptable dimension values may indicate that portions of the fill material contain voids to such an extent that further adaptations to the metalization process are unwarranted. By way of further illustration, analysis of the unacceptable dimensions may indicate that a simple adaptation is appropriate. After the analyses, relevant metalization components corresponding to grid blocks with unacceptable fill values are controlled to regulate the metalization of the respective wafer portions to facilitate achieving desired dimensions. For example, parameters including, but not limited to power, temperature, concentration, and fill rate may be adjusted. The present iteration is then ended and the process returns to 1120 to perform another iteration. Data concerning the fill process (characterizing information) is sent to memory so that future metalization process can be performed smoothly.

Figure 14:
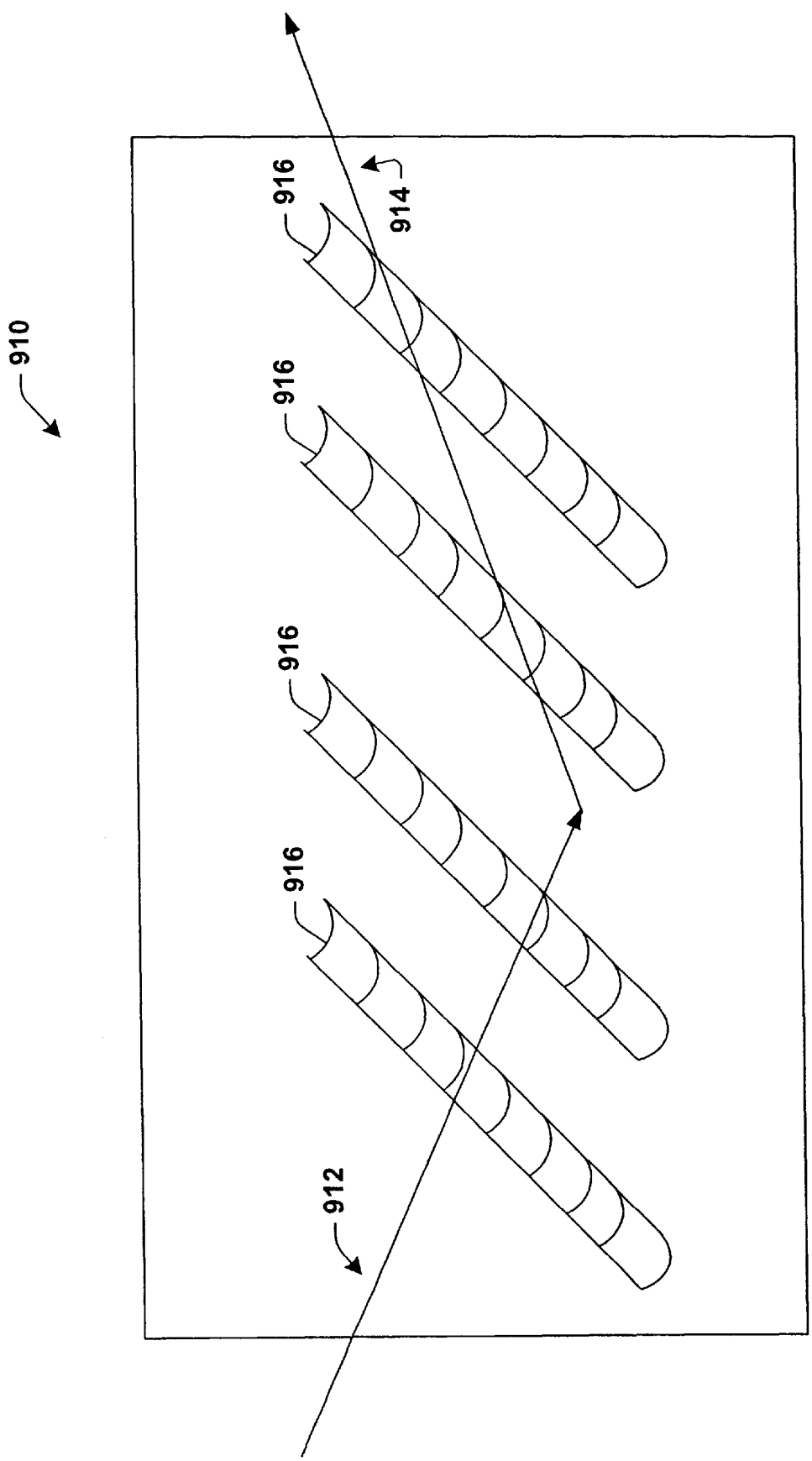
FIG. 14 is a simplified perspective view of an incident light reflecting off a surface, in accordance with an aspect of the present invention.

Turning now to FIG. 14, the concept of scatterometry and how it is employed in the present invention is discussed. Scatterometry is a technique for extracting information about a surface upon which an incident light has been directed. Scatterometry is a metrology that relates the geometry of a sample to its scattering effects. Scatterometry is based on the reconstruction of a grating profile from its optical diffraction responses. Information concerning properties including, but not limited to, dishing, erosion, profile, planarity, thickness of surfaces and critical dimensions of features present on the surface can be extracted. The information can be extracted by comparing the phase and/or intensity of a light directed onto the surface with phase and/or intensity signals of a complex reflected and/or diffracted light resulting from the incident light reflecting from and/or being diffracted by the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface. In the present invention, the intensity and/or phase of the reflected and/or diffracted light will be examined as it relates to critical dimensions desired on the wafer being trimmed.

Different combinations of the above-mentioned properties will have different effects on the phase and/or intensity of the incident light resulting in substantially unique intensity/phase signatures in the complex reflected and/or diffracted light. Thus, by examining a signal (signature or stored value) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk, \text{ where } j \text{ is an imaginary number.}$$

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a trench of a first width may generate a first signature while a trench of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

To illustrate the principles described above, reference is now made to FIG. 14, where an incident light 912 is directed at a surface 910, upon which one or more features 916 may exist. The incident light 912 is reflected as reflected light 914. The properties of the surface 910, including but not limited to, thickness, uniformity, planarity, chemical composition and the presence of features, can affect the reflected light 914. The features 916 are trenches within the surface 910. The phase and intensity of the reflected light 914 can be measured and plotted.

Figure 15:
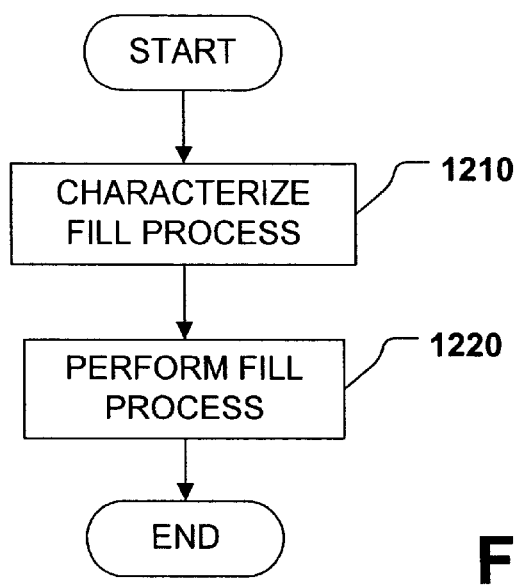
FIG. 15 is a flow diagram illustrating another specific methodology for carrying out the present invention.

Referring to FIG. 15, a flow diagram for one aspect of the invention is shown. At 1210, a standard calibration wafer is provided. The standard calibration wafer has fill features of known dimensions. The standard calibration wafer is subjected to a metalization process, and the metalization process is monitored and conducted in such a manner as to fill the fill features with metal while minimizing the formation of voids in the metal fill. In this sense, the fill process is characterized, so that aspects of the fill process for particular fill features are optimized, such as fill rate, power, critical dimensions, surface profile, concentration, and the like, and captured with data. Scatterometry is employed during the fill process to analyze the standard calibration wafer. If necessary, when void formation is detected, the process may be either changed (optimized) to avoid void formation or reversed and re-filling the fill features so that voids are minimized. Thus, data indicated when voids may form is in some instances also generated, and this data may be considered so that void formation is avoided.

At 1220, data from the fill process characterization in 1210 is employed to perform metalizations with minimal voids on production wafers. A control system with access to the data from the fill process characterization in 1210 facilitates metalizations on production wafers. Since optimum conditions and parameters are predetermined (that is, developed before processing production wafers) monitoring and analysis of production wafers is eliminated. In fact, if the standard calibration wafer is provided with numerous different fill features (many different dimensions), a sufficient amount of data may be generated to carry out a number of different metalization processes without the necessity of characterizing another standard calibration wafer.

Scatterometry may or may not be employed during the fill process on production wafers. If scatterometry is employed to monitor the fill process on production wafers, a control system can ensure that aspects or parameters of the fill process for production wafers are within about 5% or about 10% of the optimized aspects or parameters for the standard calibration wafer to mitigate the formation of voids in the metal fill.

Figure 16:
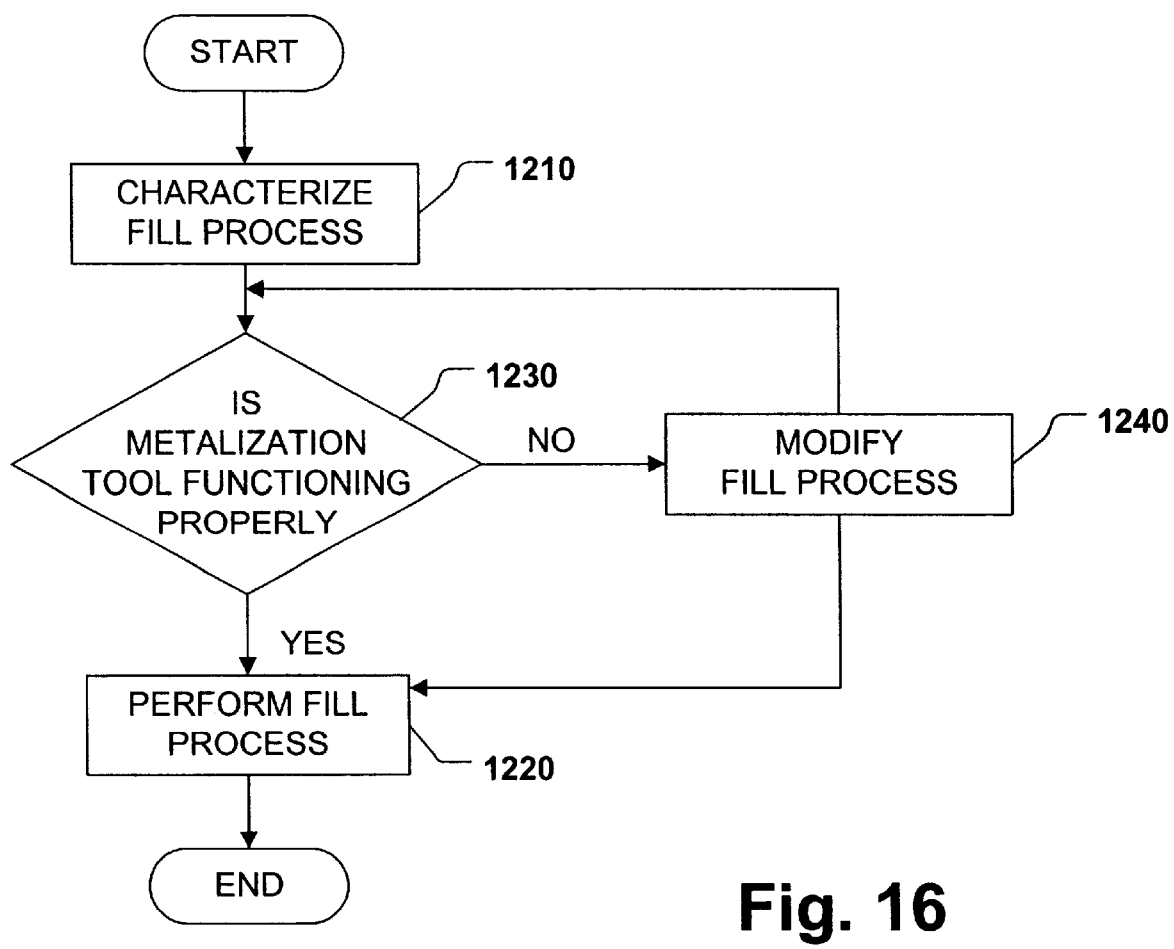
FIG. 16 is a flow diagram illustrating yet another specific methodology for carrying out the present invention.

Referring to FIG. 16, a flow diagram for one aspect of the invention is shown. At 1210, a standard calibration wafer is provided, and a fill process is characterized as described in connection with FIG. 15. After this fill process characterization, in 1230 the same standard calibration wafer is subjected to the same 1210 characterization and a determination is made as to whether the same results are obtained. If YES, then the metalization tool is functioning in the same manner as during the initial fill process 1210 characterization. As a result, metalizations 1220 with minimal voids on production wafers are performed. If NO, then the metalization tool is not functioning in the same manner as during the initial fill process 1210 characterization, and thus modifications 1240 to the fill process must be made to re-optimize the fill process. For example, debris build-up in the metalization tool or environmental conditions may prevent the metalization tool from functioning in substantially the same manner as initially characterized. After the modifications 1240 are made, either another determination 1230 is made as to whether the same results are obtained for the same 1210 characterization or metalizations 1220 with minimal voids on production wafers are performed. This enables repeated use of the standard calibration wafer in a metalization fill process, assuming metal initially deposited on the standard calibration wafer is removed first.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A metal fill process, comprising
   providing a standard calibration wafer comprising a first area of fill features having a first known dimension and a first fill characteristic, a second area of fill features having a second known dimension and a second fill characteristic, and a third area having a third known dimension and a third characteristic, the first, second, and third known dimensions and fill characteristics different from each other in a metalization tool;
   depositing a metal material into the fill features of the standard calibration wafer;
   monitoring the deposition of metal material using a sensor system coupled to the metalization tool, the sensor system directing light toward one or more gratings located on at least one portion of the standard calibration wafer and operable to measure one or more fill process parameters from light reflected from the one or more gratings wherein the sensor system generates fill process data that is saved in a data store;
   controlling the deposition of metal material to minimize void formation using a control system coupled to the metalization tool and the sensor system wherein the control system receives fill process data from the sensor system and analyzes the fill process data by comparing the fill process data to stored fill process data to generate a feed-forward control data operative to control the metalization tool; and
   depositing metal material into fill features of a production wafer in the metalization tool using the fill process data generated by the sensor system and the control system.

2. The metal fill process according to claim 1, wherein the control system comprises a processor and the processor logically maps the standard calibration wafer into one or more grid blocks and making a determination of the acceptability of fill process data in the one or more grid blocks.

3. The metal fill process according to claim 1, wherein the fill process parameters comprise at least one of fill rate, identity of metal material, power, fill feature profile, and concentration.

4. The metal fill process according to claim 1, wherein the control system is coupled to the metalization tool through a metalization tool driving system.

5. The metal fill process according to claim 1, wherein the metal material comprises at least one of aluminum, copper, chromium, hafnium, gold, nickel, palladium, platinum, silver, tantalum, titanium, tungsten, zinc, zirconium, alloys thereof, silicides thereof, and nitrides thereof.

6. The metal fill process according to claim 1, wherein the metal material is deposited by chemical vapor deposition, physical vapor deposition, sputtering, electroplating, or electroless plating.

7. The metal fill process according to claim 1, wherein the sensor system comprises a scatterometry system.

8. The metal fill process according to claim 7, wherein the control system analyzes data received from the scatterometry system and producing an analyzed data and the processor controlling, at least in part, the metalization tool based, at least in part, on the analyzed data.

9. A system for characterizing a metal fill process, comprising
   a standard calibration wafer comprising a first area of fill features having a first known dimension and a first fill characteristic, a second area of fill features having a second known dimension and a second fill characteristic, and a third area having a third known dimension and a third characteristic, the first, second, and third known dimensions and fill characteristics different from each other;
   a metalization tool;
   a supply of a metal material;
   a control system coupled to the metalization tool;
   a sensor system coupled to the control system and the metalization tool for generating metal fill process data unique to each fill feature; and
   a data store for storing metal fill process data from at least three different fill features.

10. The system according to claim 9, wherein the metalization tool comprises a furnace, a chemical vapor deposition chamber, a physical vapor deposition chamber, an electroplating device, or an electroless plating device.

11. The system according to claim 9, wherein the standard calibration wafer comprises at least one of vias, trenches, dual damascene openings, and interconnect openings.

12. The system according to claim 9, wherein the control system comprises a processor and the sensor system comprises a scatterometry system.

13. The system according to claim 9, wherein the metal material comprises at least one of aluminum, copper, chromium, hafnium, gold, nickel, palladium, platinum, silver, tantalum, titanium, tungsten, zinc, zirconium, alloys thereof, suicides thereof, and nitrides thereof.

14. The system according to claim 9, wherein the control system comprises a processor and the processor logically maps the standard calibration wafer into one or more grid blocks and makes a determination of the acceptability of fill process data in the one or more grid blocks.

15. The system according to claim 9, wherein the control system is coupled to the metalization tool through a metalization tool driving system.

16. A method for characterizing a metalization tool, comprising providing a standard calibration wafer having a plurality of fill features of known dimensions in a metalization tool;

depositing a metal material over the standard calibration wafer;

monitoring the deposition of metal material using a sensor system coupled to the metalization tool, the sensor system directing light toward one or more gratings located on at least one portion of the standard calibration wafer and operable to measure one or more fill process parameters from light reflected from the one or more gratings wherein the sensor system generates fill process data that is saved in a data store;

controlling the deposition of metal material to minimize void formation using a control system coupled to the metalization tool and the sensor system wherein the control system receives fill process data from the sensor system and analyzes the fill process data by comparing the fill process data to stored fill process data to generate a feed-forward control data operative to control the metalization tool;

depositing the metal material over the a second standard calibration wafer having a plurality of fill features of the same dimensions as the standard calibration wafer in the metalization tool using the same fill process parameters, wherein the second standard calibration wafer is the standard calibration wafer after removing the metal material therefrom; and comparing the fill process data of the second standard calibration wafer with the fill process data of the standard calibration wafer.

17. The method according to claim 16, wherein the second standard calibration wafer is a different wafer from the standard calibration wafer.

18. The method according to claim 16, wherein the sensor system comprises a scatterometry system.

19. The method according to claim 16, wherein the control system comprises a processor and the processor logically maps the standard calibration wafer into one or more grid blocks and makes a determination of the acceptability of fill process data in the one or more grid blocks.

20. The method according to claim 16, wherein the standard calibration wafer comprises a first area of fill features having a first known dimension and a first fill characteristic, a second area of fill features having a second known dimension and a second fill characteristic, and a third area having a third known dimension and a third characteristic, the first, second, and third known dimensions and fill characteristics different from each other.

* * * * *